United States Patent
Xiang (10) Patent No.: US 12,506,105 B2
(45) Date of Patent: Dec. 23, 2025

(54) ARRAY SUBSTRATE, METHOD OF MANUFACTURING SAME, DISPLAY PANEL

(71) Applicant: TCL CHINA STAR OPTOELECTRONICS TECHNOLOGY CO., LTD., Shenzhen (CN)

(72) Inventor: Changming Xiang, Shenzhen (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 1282 days.

(21) Appl. No.: 17/053,754

(22) PCT Filed: Oct. 10, 2020

(86) PCT No.: PCT/CN2020/120100
§ 371 (c)(1),
(2) Date: Nov. 6, 2020

(87) PCT Pub. No.: WO2022/047879
PCT Pub. Date: Mar. 10, 2022

(65) Prior Publication Data
US 2022/0320030 A1   Oct. 6, 2022

(30) Foreign Application Priority Data

Sep. 3, 2020   (CN) .......................... 202010914000.8

(51) Int. Cl.
*H01L 23/00*   (2006.01)

(52) U.S. Cl.
CPC .............. *H01L 24/32* (2013.01); *H01L 24/29* (2013.01); *H01L 24/83* (2013.01);
(Continued)

(58) Field of Classification Search
CPC ............... H01L 27/124; H01L 27/1218; H01L 25/0753; H01L 25/167; H01L 27/156;
(Continued)

(56) References Cited

U.S. PATENT DOCUMENTS

| 2015/0179670 A1 | 6/2015 | Kang et al. |
| 2019/0204669 A1 | 7/2019 | Lee et al. |
| 2020/0301193 A1* | 9/2020 | Lee .......................... H05K 5/03 |

FOREIGN PATENT DOCUMENTS

| CN | 104181734 A | 12/2014 |
| CN | 106353904 A | 1/2017 |

(Continued)

OTHER PUBLICATIONS

International Search Report in International application No. PCT/CN2020/120100, mailed on May 25, 2021.
(Continued)

*Primary Examiner* — Julio J Maldonado
*Assistant Examiner* — Stanetta D Isaac
(74) *Attorney, Agent, or Firm* — PV IP PC; Wei Te Chung (57) ABSTRACT

An array substrate, a method of manufacturing the same, and a display panel are provided. The array substrate includes a base; a driving circuit layer; a bonding region defined on a surface of the base opposite to another surface of the base facing the driving circuit layer and configured to bond an outside circuit; and a back bonding structure electrically connected to the driving circuit layer and the bonding region. The back bonding structure includes a first connection part and a patterned conductive circuit. The first connection part is provided at the bonding region. The patterned conductive circuit is attached on a side surface of the base, a side surface of the driving circuit layer, and a side surface of the first connection part.

12 Claims, 4 Drawing Sheets

(52) U.S. Cl.
CPC ............... *H01L 2224/2929* (2013.01); *H01L 2224/29299* (2013.01); *H01L 2224/32227* (2013.01); *H01L 2224/8385* (2013.01)

(58) Field of Classification Search
CPC .. G02F 1/13452; G02F 1/133; G02F 1/13336; G09G 2300/0426; G09G 2300/026; G09F 9/3026; H10K 59/18
See application file for complete search history.

(56) References Cited

FOREIGN PATENT DOCUMENTS

| | | |
|---|---|---|
| CN | 106547154 A | 3/2017 |
| CN | 108089382 A | 5/2018 |
| CN | 108957812 A | 12/2018 |
| CN | 108957878 A | 12/2018 |
| CN | 109739057 A | 5/2019 |
| CN | 109962095 A | 7/2019 |
| CN | 110515481 A | 11/2019 |
| CN | 110596962 A | 12/2019 |
| CN | 110911393 A | 3/2020 |
| CN | 111402754 A | 7/2020 |
| JP | H1124093 A | 1/1999 |

OTHER PUBLICATIONS

Written Opinion of the International Search Authority in International application No. PCT/CN2020/120100, mailed on May 25, 2021.
Chinese Office Action issued in corresponding Chinese Patent Application No. 202010914000.8 dated Mar. 22, 2021, pp. 1-7.
Chinese Office Action issued in corresponding Chinese Patent Application No. 202010914000.8 dated Aug. 9, 2021, pp. 1-7.

\* cited by examiner

ARRAY SUBSTRATE, METHOD OF MANUFACTURING SAME, DISPLAY PANEL

FIELD

The present disclosure relates to display technologies, and more particularly, to an array substrate, a method of manufacturing the same, and a display panel.

BACKGROUND

With a development of display technologies, full screens have become a hot spot in the market. A screen-to-body ratio of a full screen product can reach more than 90% to a limitation of a current technology. A display panel usually adopts a narrow border or borderless design. However, the use of a narrow border or borderless design puts forward higher requirements for driver IC packaging. A connection between a driver IC and the display panel is completed through a bonding process. During a preparation process of the display panel, a binding position of the driver IC is reserved. In order to achieve a narrow border or borderless design, it is necessary to dispose the driver IC such as a chip on film (COF) bending to a back of the display panel, and set a bonding area of an external circuit on the back of the display panel. However, the circuit of the bent COF is not only prone to damage, which affects a circuit conduction, but also has a large gap with the side of the display panel. Even if the driver IC is arranged on the back of the display panel through a bonding structure, and then a printed circuit board is bonded to the driver IC to avoid the bending of the COF, due to technical limitations, the existing bonding structure is not compatible with the display panel. There are still gaps on the side, and a certain width of a outer border needs to be set to block. It is impossible to achieve narrow border or borderless displays, especially spliced displays.

SUMMARY

In view of the above, the present disclosure provides an array substrate, a method of manufacturing the same, a display panel, and a spliced display to resolve issues of larger gaps between a bonding structure and a side of a display panel and a narrow border or borderless display design.

In order to achieve above-mentioned object of the present disclosure, one embodiment of the disclosure provides an array substrate, including:

a base;

a driving circuit layer disposed on the base;

a bonding region defined on a surface of the base opposite to another surface of the base facing the driving circuit layer and configured to bond an outside circuit; and a back bonding structure electrically connected to the driving circuit layer and the bonding region, wherein the back bonding structure includes a first connection part and a patterned conductive circuit, the first connection part is provided at the bonding region, the patterned conductive circuit is attached on a side surface of the base, a side surface of the driving circuit layer, and a side surface of the first connection part, one end of the patterned conductive circuit is electrically connected to the driving circuit layer, and another end of the patterned conductive circuit is electrically connected to the first connection part.

In one embodiment of the array substrate, a material of the patterned conductive circuit includes conductive polymer.

In one embodiment of the array substrate, the conductive polymer is a composite material including a photo-curable material and a conductive filler.

In one embodiment of the array substrate, the back bonding structure includes a second connection part disposed on a surface of the driving circuit layer opposite to another surface of the driving circuit layer facing the base, and the second connection part is connected to the driving circuit layer and the patterned conductive circuit.

In one embodiment of the array substrate, the first connection part includes a first part covered by the patterned conductive circuit and a second part not covered by the patterned conductive circuit, and the outside circuit is connected to the second part.

In one embodiment of the array substrate, the patterned conductive circuit covers all the first connection part, and the outside circuit is connected to a region of the patterned conductive circuit covering the first connection part.

Another embodiment of the disclosure further provides a method of manufacturing an array substrate, including steps of:

providing a base and providing a driving circuit layer on the base;

providing a bonding region on a surface of the base opposite to another surface of the base facing the driving circuit layer for bonding an outside circuit; and providing a back bonding structure connected to the bonding region and the driving circuit layer, wherein the step of providing the back bonding structure further includes steps of: providing a first connection part at the bonding region, and providing a patterned conductive circuit attached on a side surface of the base, a side surface of the driving circuit layer and a side surface of the first connection part, wherein one end of the patterned conductive circuit is electrically connected to the driving circuit layer and another end of the patterned conductive circuit is electrically connected to the first connection part.

In one embodiment of the method of manufacturing the array substrate, the step of providing the patterned conductive circuit further includes:

coating a conductive pre-polymer film on the side surface of the base, the side surface of the driving circuit layer, and the side surface of the first connection part, and exposing and developing the conductive pre-polymer film to form the patterned conductive circuit.

In one embodiment of the method of manufacturing the array substrate, a material of the patterned conductive circuit includes conductive polymer.

In one embodiment of the method of manufacturing the array substrate, the conductive polymer is a composite material including a photo-curable material and a conductive filler.

In one embodiment of the method of manufacturing the array substrate, the step of providing the back bonding structure further includes: providing a second connection part disposed on a surface of the driving circuit layer opposite to another surface of the driving circuit layer facing the base, wherein the second connection part is connected to the driving circuit layer and the patterned conductive circuit.

In one embodiment of the disclosure, the method of manufacturing the array substrate further includes steps of: covering a portion of a surface of the first connection part opposite to another surface of the first connection part facing the base by the patterned conductive circuit, and connecting another portion of the surface of the first connection part not covered by the patterned conductive circuit with the outside circuit.

In one embodiment of the disclosure, the method of manufacturing the array substrate further includes steps of: covering all the first connection part by the patterned conductive circuit, and connecting the outside circuit with a region of the patterned conductive circuit covering the first connection part.

Another embodiment of the disclosure further provides a display panel, including an array substrate, wherein the array substrate includes:
- a base;
- a driving circuit layer disposed on the base;
- a bonding region defined on a surface of the base opposite to another surface of the base facing the driving circuit layer and configured to bond an outside circuit; and
- a back bonding structure electrically connected to the driving circuit layer and the bonding region, wherein the back bonding structure includes a first connection part and a patterned conductive circuit, the first connection part is provided at the bonding region, the patterned conductive circuit is attached on a side surface of the base, a side surface of the driving circuit layer, and a side surface of the first connection part, one end of the patterned conductive circuit is electrically connected to the driving circuit layer, and another end of the patterned conductive circuit is electrically connected to the first connection part.

In one embodiment of the display panel, a material of the patterned conductive circuit includes conductive polymer.

In one embodiment of the display panel, the conductive polymer is a composite material including a photo-curable material and a conductive filler.

In one embodiment of the display panel, the back bonding structure includes a second connection part disposed on a surface of the driving circuit layer opposite to another surface of the driving circuit layer facing the base, and the second connection part is connected to the driving circuit layer and the patterned conductive circuit.

In one embodiment of the display panel, the first connection part includes a first part covered by the patterned conductive circuit and a second part not covered by the patterned conductive circuit, and the outside circuit is connected to the second part.

In one embodiment of the display panel, the patterned conductive circuit covers all the first connection part, and the outside circuit is connected to a region of the patterned conductive circuit covering the first connection part.

Another embodiment of the disclosure further provides a spliced display spliced with a plurality of the abovementioned display panels.

In comparison with prior art, the disclosure provides the array substrate, including: a base, a driving circuit layer, and a back bonding structure. A bonding region is defined on a surface of the base opposite to another surface of the base facing the driving circuit layer and configured to bond an outside circuit. The back bonding structure includes a first connection part and a patterned conductive circuit. The first connection part is provided at the bonding region. The patterned conductive circuit is attached on a side surface of the base, a side surface of the driving circuit layer, and a side surface of the first connection part. The patterned conductive circuit is closely attached on a side surface of the array substrate. One end of the patterned conductive circuit is electrically connected to the driving circuit layer, and another end of the patterned conductive circuit is electrically connected to the first connection part. The patterned conductive structure prevents from larger gaps between a back bonding structure and the side surface of the array substrate and is conductive to realization of ultra-narrow border or borderless displays, especially spliced displays.

BRIEF DESCRIPTION OF DRAWINGS

In the following, in conjunction with accompanying drawings, through a detailed description of the detail implementations of the present application, the technical solutions and other beneficial effects of the present application will be clearly.

DETAILED DESCRIPTION

The technical solutions in the embodiments of the present application will be described clearly and completely in conjunction with the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

In order to make the objectives, technical solutions, and advantages of the present application clearer, the following will further describe the embodiments of the present application in detail with reference to the accompanying drawings.

Figure 1:
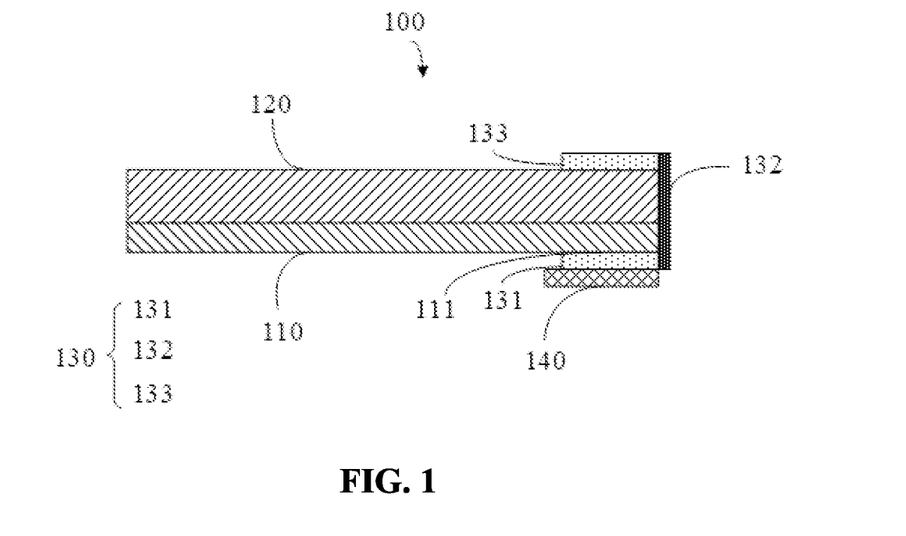
FIG. 1 is a schematic cross-sectional view of an array substrate according to an embodiment of the present disclosure.

Referring to FIG. 1, FIG. 1 is a schematic cross-sectional view of an array substrate according to an embodiment of the present disclosure. One embodiment of the disclosure provides an array substrate 100, including: a base 110 and a driving circuit layer 120 disposed on the base 110. A bonding region 111 is defined on a surface of the base 110 opposite to another surface of the base 110 facing the driving circuit layer 120 and configured to bond an outside circuit 140. The outside circuit 140 includes a driver IC and a printed circuit board connected to the driver IC. In detail, the bonding region 111 is configured to bond the driver IC. In one embodiment, the driver IC is a chip on film (COF)

package or a tape carrier package (TCP), the disclosure is not limited here. The bonding region 111 is defined at an edge region of the base 110 as shown in FIG. 1. The array substrate 100 further includes a back bonding structure 130 electrically connected to the driving circuit layer 120 and the bonding region 111, in detail, electrically connected to a thin film transistor of the driving circuit layer 120. The back bonding structure 130 includes a first connection part 131 and a patterned conductive circuit 132. The first connection part 131 is provided at the bonding region 111, the patterned conductive circuit 132 is attached on a side surface of the base 110, a side surface of the driving circuit layer 120, and a side surface of the first connection part 131. One end of the patterned conductive circuit 132 is electrically connected to the driving circuit layer 120, in detail, electrically connected to a thin film transistor of the driving circuit layer 120, and another end of the patterned conductive circuit 132 is electrically connected to the first connection part 131.

In one embodiment of the array substrate, the back bonding structure 130 further includes a second connection part 1330 disposed on a surface of the driving circuit layer 120 opposite to another surface of the driving circuit layer 120 facing the base 110, and the second connection part 133 is connected to the driving circuit layer 120 and the patterned conductive circuit 132. The patterned conductive circuit 132 is connected to the driving circuit layer 120 through the second connection part 133.

Figure 2:
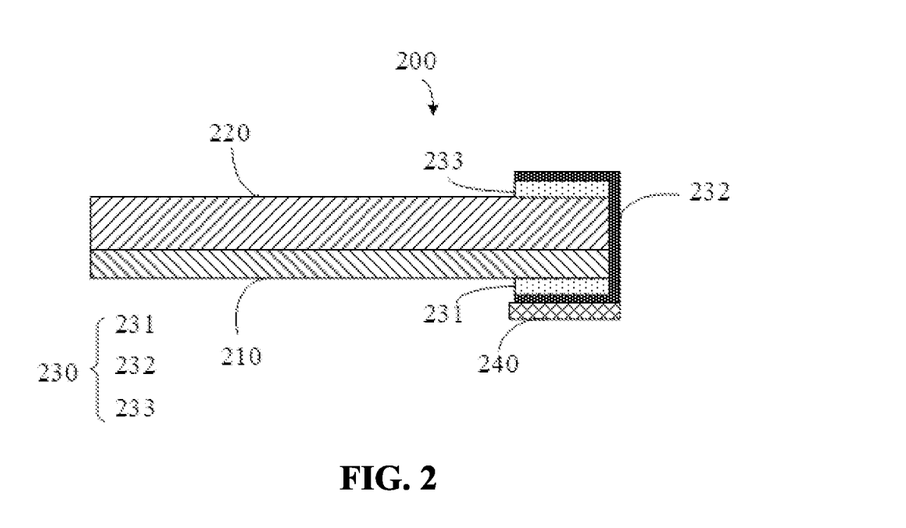
FIG. 2 is a schematic cross-sectional view of another array substrate according to an embodiment of the present disclosure.

Referring to FIG. 2, FIG. 2 is a schematic cross-sectional view of another array substrate 200 according to an embodiment of the present disclosure. The difference between the array substrate 200 and the array substrate 100 is back bonding structure 230. In detail, the patterned conductive circuit 232 is disposed on the base 210, and a side surface of the driving circuit layer 220, and further covers all the first connection part 231. The outside circuit 240 is connected to a region of the patterned conductive circuit 232 covering the first connection part 231. In detail, the driver IC is connected to the region of the patterned conductive circuit 232 covering the first connection part 231. In other embodiment, the patterned conductive circuit 232 covers all the second connection part 233 or partially covers the second connection part 233. The second connection part 233 is connected to the thin film transistor in the driver circuit layer 220.

Figure 3:
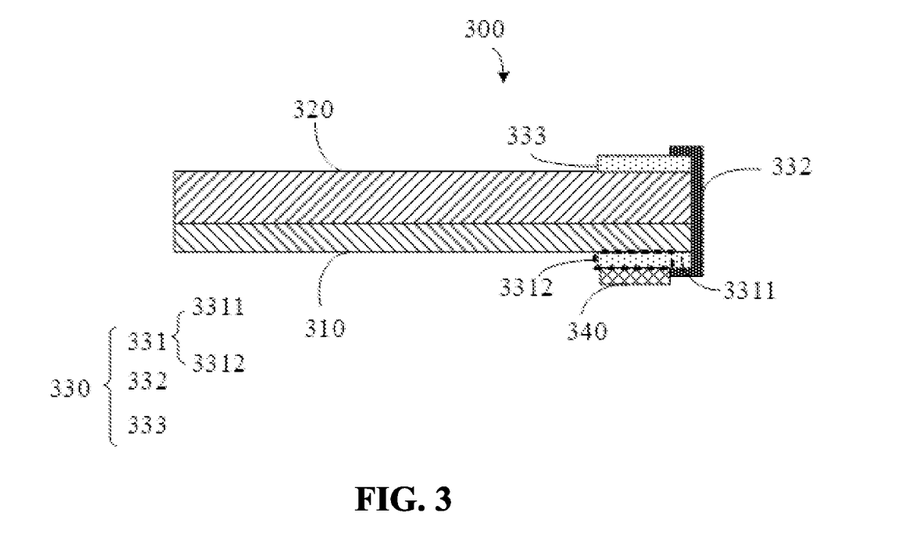
FIG. 3 is a schematic cross-sectional view of further another array substrate according to an embodiment of the present disclosure.

Referring to FIG. 3, FIG. 3 is a schematic cross-sectional view of further another array substrate 300 according to an embodiment of the present disclosure. The difference between the array substrate 300 and the array substrate 100 is back bonding structure 330. In detail, the patterned conductive circuit 332 is disposed on the base 310, and a side surface of the driving circuit layer 320, and further covers a first part 3311 of the first connection part 331. The first connection part not covered by the patterned conductive circuit 332 is defined as a second part 3312. The driver IC in the outside circuit 340 is connected to the second part 3312. In other embodiment, the patterned conductive circuit 332 covers all the second connection part 333 or partially covers the second connection part 333. The second connection part 333 is connected to the thin film transistor in the driver circuit layer 320.

The patterned conductive circuit described above can be made of conductive polymer. The conductive polymer may be a conductive composite material, and its resistivity ranges from $10^{-7}$ to $10^{-5}$ Ω·m. The conductive composite material is usually formed by adding conductive fillers to a matrix such as resin. The conductive polymer not only has good conductivity, but also has high corrosion resistance, bending resistance and strong designability. Due to the bending resistance or fatigue resistance of the conductive polymer, damage to the patterned conductive circuit during a bending process can be avoided, and a stability of the display panel can be improved. Due to its strong designability, it can be closely attached to the side of the array substrate by using certain manufacturing process and certain physical properties. Of course, the material of the patterned conductive circuit of the present application is not limited to conductive polymer, and may also be other materials with bending resistance and high conductivity. There are no limitation here.

In some embodiments, the matrix may be a photosensitive resin. Such as epoxy acrylate, polyurethane acrylate, unsaturated polyester, polyester acrylate, polyether acrylate, pure acrylic resin, epoxy resin, silicone oligomer, etc. The epoxy acrylate may be bisphenol A epoxy acrylate, novolac epoxy acrylate, or the like. The silicone oligomer may be a silicone acrylate oligomer with an acryloxy group. The conductive filler may be metal or conductive carbon material. The metal may be a nano-scale metal, such as nano-silver. The conductive carbon material can be carbon fillers such as carbon black, carbon nanotubes, carbon fibers, and graphene.

In one embodiment, a photocurable resin is a mixed ester composed of epoxy acrylate and urethane acrylate with a ratio of the amount of substances 2:3. The conductive filler is nano-silver, and a filling amount of the nano-silver is 60% (the filling amount refers to the percentage of the mass of the nano-silver to the total mass of the nano-silver and the photocurable resin). The nano-silver may be one of silver nano-spherical particles or silver nano-flakes, or a mixture of the two. In this embodiment, the nano-silver is a mixture of silver nano-spherical particles and silver nano-flakes, wherein the mass ratio of silver nano-spherical particles and silver nano-flakes is 3:7.

The disclosure provides the array substrate including the back bonding structure with the patterned conductive circuit closely attached on a side surface of the base and the driving circuit layer, bent to a back surface of the base, and bonding with the driver IC at the back surface of the base to prevent from gaps and to be conductive to realization of ultra-narrow border or borderless displays, especially spliced displays.

Figure 4:
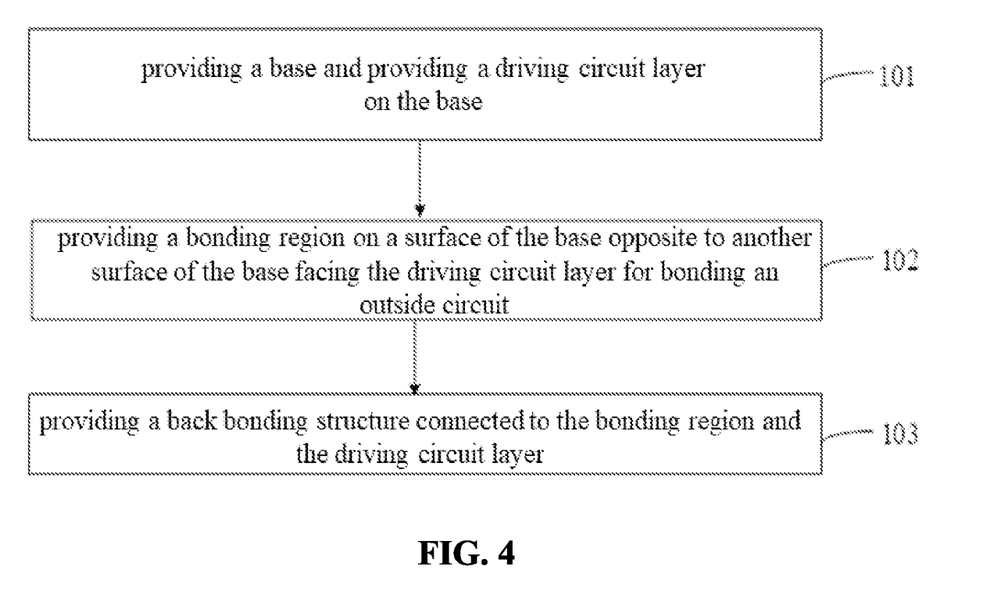
FIG. 4 is a schematic view of a flowchart of a method of manufacturing an array substrate according to an embodiment of the present disclosure.

Referring to FIG. 4, another embodiment of the disclosure further provides a method of manufacturing an array substrate, including steps of:

At step 101: providing a base and providing a driving circuit layer on the base;

The driving circuit layer includes a thin film transistor and other elements, please refer to the prior art for detail, which will not be described here.

At step 102: providing a bonding region on a surface of the base opposite to another surface of the base facing the driving circuit layer for bonding an outside circuit;

In detail, the bonding region is defined at an edge region on a surface of the base opposite to another surface of the base facing the driving circuit layer. The outside circuit includes a driver IC and a printed circuit board connected to the driver IC. In detail. The bonding region is configured to bond the driver IC.

At step 103: providing a back bonding structure connected to the bonding region and the driving circuit layer, Further, the step of providing the back bonding structure further includes steps of: providing a first connection part at the bonding region, and providing a patterned conductive circuit closely attached on a side surface of the base, a side surface of the driving circuit layer and a side surface of the first connection part. One end of the patterned conductive circuit is electrically connected to the driving circuit layer and another end of the patterned conductive circuit is electrically connected to the first connection part.

In one embodiment of the method of manufacturing the array substrate, the step of providing the back bonding structure further includes: providing a second connection part disposed on a surface of the driving circuit layer opposite to another surface of the driving circuit layer facing the base. The second connection part is connected to the driving circuit layer and the patterned conductive circuit.

In one embodiment of the method of manufacturing the array substrate, the step of providing the patterned conductive circuit further includes: coating a conductive pre-polymer film on the side surface of the base, the side surface of the driving circuit layer, and the side surface of the first connection part, and exposing and developing the conductive pre-polymer film to form the patterned conductive circuit.

Figure 5:
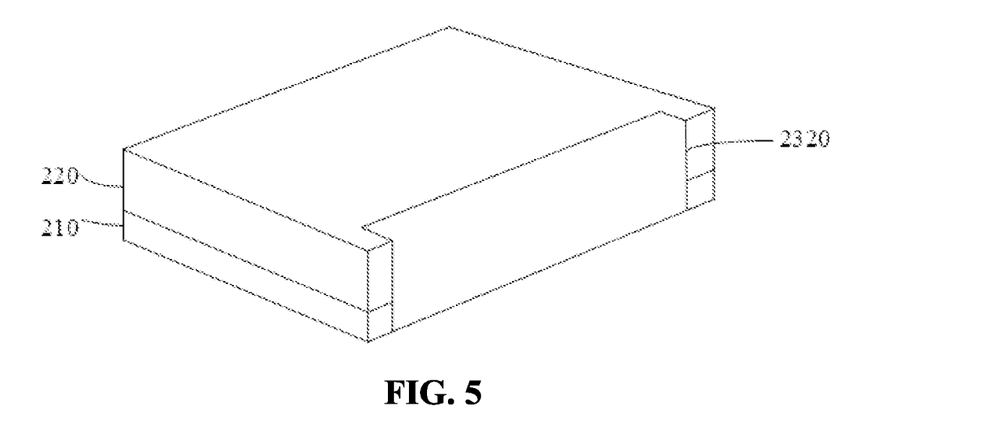
FIG. 5 is a schematic view of a structure of an array substrate after coating a conductive pre-polymer film in a process of manufacturing an array substrate according to an embodiment of the present disclosure.

In detail, take a process of manufacturing the array substrate 200 as an example, referring to FIG. 5 and FIG. 2, coating the conductive pre-polymer film 2320 on the side surface of the base 210, the side surface of the driving circuit layer 220, and the side surface of the first connection part 231 (not shown in FIG. 5), and on the surfaces of the first connection part 231 and the second connection part 233. A coating thickness ranges from 20 μm to 30 μm. A coating method can be spray coating, spin coating or electroplating. The conductive prepolymer is a mixture of photocurable resin, conductive filler and photo-initiator.

In some embodiments, the photocurable resin (photosensitive resin) may be an epoxy acrylate, polyurethane acrylate, unsaturated polyester, polyester acrylate, polyether acrylate, pure acrylic resin, epoxy resin, silicone oligomer, etc. The epoxy acrylate may be bisphenol A epoxy acrylate, novolac epoxy acrylate, or the like. The silicone oligomer may be a silicone acrylate oligomer with an acryloxy group. The conductive filler may be metal or conductive carbon material. The metal may be a nano-scale metal, such as nano-silver. The conductive carbon material can be carbon fillers such as carbon black, carbon nanotubes, carbon fibers, and graphene.

In one embodiment, the photocurable resin is a mixed ester composed of epoxy acrylate and urethane acrylate with a ratio of the amount of substances 2:3. The conductive filler is nano-silver, and a filling amount of the nano-silver is 60% (the filling amount refers to the percentage of the mass of the nano-silver to the total mass of the nano-silver and the photocurable resin). The nano-silver may be one of silver nano-spherical particles or silver nano-flakes, or a mixture of the two. In this embodiment, the nano-silver is a mixture of silver nano-spherical particles and silver nano-flakes, wherein the mass ratio of silver nano-spherical particles and silver nano-flakes is 3:7.

Figure 6:
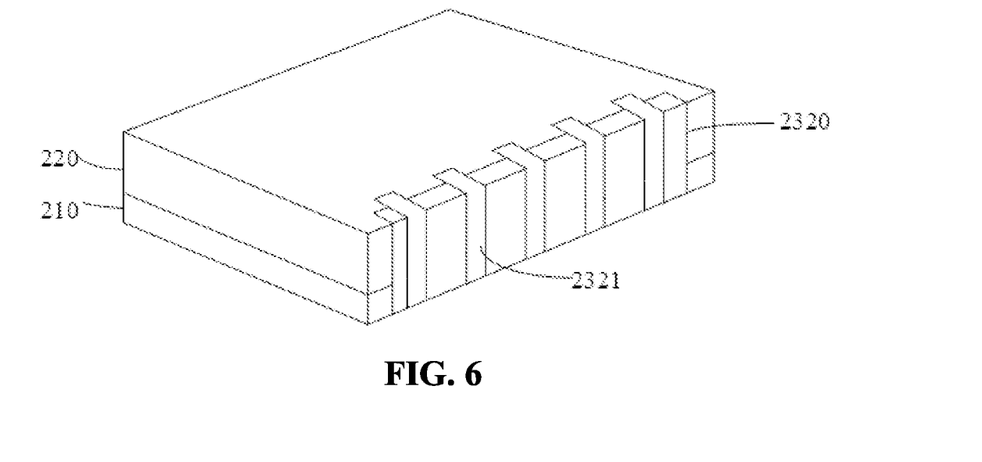
FIG. 6 is a schematic view of a structure of an array substrate while exposing in a process of manufacturing an array substrate according to an embodiment of the present disclosure.

Referring to FIG. 6, the conductive pre-polymer film is undergoing an exposing and curing process with a mask 2321 covering part of the conductive pre-polymer film. An ultra-violet light may be used in the exposing process. A duration of the exposing and curing process ranges from 6 seconds to 7 seconds.

Figure 7:
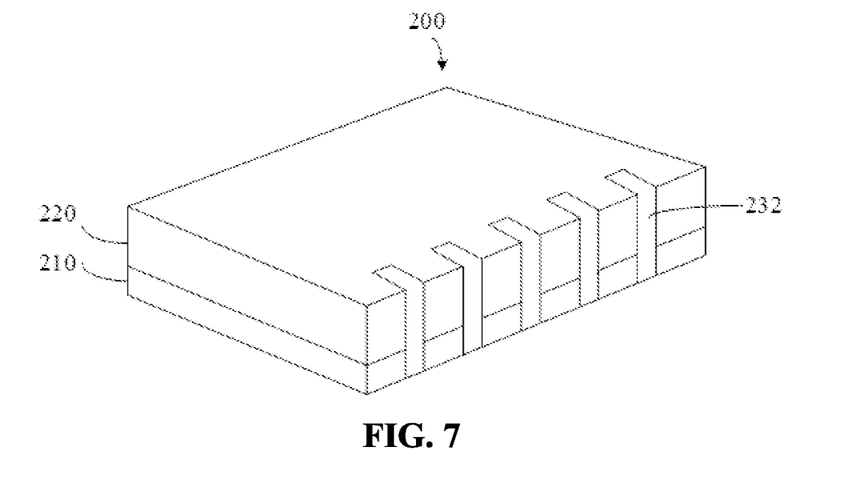
FIG. 7 is a schematic view of a structure of an array substrate after developing in a process of manufacturing an array substrate according to an embodiment of the present disclosure.

Referring to FIG. 7, the exposed conductive pre-polymer film is dipping in a solution. An un-exposed part of the conductive pre-polymer film is resolved in the solution and removed to form the patterned conductive circuit 232.

The disclosure provides the method of manufacturing the array substrate, including coating, exposing, and developing. The process is simple, and the operation is easy. The obtained patterned conductive structure is attached closely on the side surface of the array substrate and prevented from larger gaps. It is conductive to realization of ultra-narrow border or borderless spliced displays.

Another embodiment of the disclosure further provides a display panel, including the abovementioned array substrate. The display panel can be a LCD display panel, mini-LED display panel, of micro-LED display panel.

Another embodiment of the disclosure further provides a spliced display spliced with a plurality of the abovementioned display panels.

The present disclosure of an array substrate, a method of manufacturing the same, a display panel, and a spliced display have been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. An array substrate, comprising:
   a base;
   a driving circuit layer disposed on the base;
   a bonding region defined on a surface of the base opposite to another surface of the base facing the driving circuit layer and configured to bond an outside circuit; and
   a back bonding structure electrically connected to the driving circuit layer and the bonding region, wherein the back bonding structure comprises a first connection part and a patterned conductive circuit, the first connection part is provided at the bonding region, the patterned conductive circuit is attached on a side surface of the base, a side surface of the driving circuit layer, and a side surface of the first connection part, one end of the patterned conductive circuit is electrically connected to the driving circuit layer, and another end of the patterned conductive circuit is electrically connected to the first connection part;
   wherein a material of the patterned conductive circuit comprises conductive polymer; and
   wherein the conductive polymer is a composite material comprising a photo-curable material and a conductive filler.

2. The array substrate according to claim 1, wherein the back bonding structure comprises a second connection part disposed on a surface of the driving circuit layer opposite to another surface of the driving circuit layer facing the base, and the second connection part is connected to the driving circuit layer and the patterned conductive circuit.

3. The array substrate according to claim 1, wherein the first connection part comprises a first part covered by the patterned conductive circuit and a second part not covered by the patterned conductive circuit, and the outside circuit is connected to the second part.

4. The array substrate according to claim 1, wherein the patterned conductive circuit covers all the first connection part, and the outside circuit is connected to a region of the patterned conductive circuit covering the first connection part.

5. A method of manufacturing an array substrate, comprising steps of:
   providing a base and providing a driving circuit layer on the base;
   providing a bonding region on a surface of the base opposite to another surface of the base facing the driving circuit layer for bonding an outside circuit; and
   providing a back bonding structure connected to the bonding region and the driving circuit layer, wherein the step of providing the back bonding structure further comprises steps of: providing a first connection part at the bonding region, and providing a patterned conductive circuit attached on a side surface of the base, a side surface of the driving circuit layer and a side surface of the first connection part, wherein one end of the patterned conductive circuit is electrically connected to the driving circuit layer and another end of the patterned conductive circuit is electrically connected to the first connection part;

wherein the step of providing the patterned conductive circuit further comprises: coating a conductive pre-polymer film on the side surface of the base, the side surface of the driving circuit layer, and the side surface of the first connection part, and exposing and developing the conductive pre-polymer film to form the patterned conductive circuit;

wherein a material of the patterned conductive circuit comprises conductive polymer; and wherein the conductive polymer is a composite material comprising a photo-curable material and a conductive filler.

6. The method of manufacturing the array substrate according to claim 5, wherein the step of providing the back bonding structure further comprises: providing a second connection part disposed on a surface of the driving circuit layer opposite to another surface of the driving circuit layer facing the base, wherein the second connection part is connected to the driving circuit layer and the patterned conductive circuit.

7. The method of manufacturing the array substrate according to claim 5, further comprising steps of: covering a portion of a surface of the first connection part opposite to another surface of the first connection part facing the base by the patterned conductive circuit, and connecting another portion of the surface of the first connection part not covered by the patterned conductive circuit with the outside circuit.

8. The method of manufacturing the array substrate according to claim 5, further comprising steps of: covering all the first connection part by the patterned conductive circuit, and connecting the outside circuit with a region of the patterned conductive circuit covering the first connection part.

9. A display panel, comprising an array substrate, wherein the array substrate comprises:
   a base;
   a driving circuit layer disposed on the base;
   a bonding region defined on a surface of the base opposite to another surface of the base facing the driving circuit layer and configured to bond an outside circuit; and
   a back bonding structure electrically connected to the driving circuit layer and the bonding region, wherein the back bonding structure comprises a first connection part and a patterned conductive circuit, the first connection part is provided at the bonding region, the patterned conductive circuit is attached on a side surface of the base, a side surface of the driving circuit layer, and a side surface of the first connection part, one end of the patterned conductive circuit is electrically connected to the driving circuit layer, and another end of the patterned conductive circuit is electrically connected to the first connection part;
   wherein a material of the patterned conductive circuit comprises conductive polymer; and
   wherein the conductive polymer is a composite material comprising a photo-curable material and a conductive filler.

10. The display panel according to claim 9, wherein the back bonding structure comprises a second connection part disposed on a surface of the driving circuit layer opposite to another surface of the driving circuit layer facing the base, and the second connection part is connected to the driving circuit layer and the patterned conductive circuit.

11. The display panel according to claim 9, wherein the first connection part comprises a first part covered by the patterned conductive circuit and a second part not covered by the patterned conductive circuit, and the outside circuit is connected to the second part.

12. The display panel according to claim 9, wherein the patterned conductive circuit covers all the first connection part, and the outside circuit is connected to a region of the patterned conductive circuit covering the first connection part.

* * * * *